US006642666B1

(12) United States Patent
St-Germain

(10) Patent No.: US 6,642,666 B1
(45) Date of Patent: Nov. 4, 2003

(54) METHOD AND DEVICE TO EMULATE A RAILWAY SEARCHLIGHT SIGNAL WITH LIGHT EMITTING DIODES

(75) Inventor: Nicolas St-Germain, Saint Bruno (CA)

(73) Assignee: Gelcore Company, Quebec (CA)

( * ) Notice: Subject to any disclaimer, the term of this patent is extended or adjusted under 35 U.S.C. 154(b) by 182 days.

(21) Appl. No.: 09/693,140

(22) Filed: Oct. 20, 2000

(51) Int. Cl.[7] .......................... H05B 37/00; H01L 27/14

(52) U.S. Cl. .................... 315/185.5; 315/312; 315/320; 315/324; 315/363; 362/800; 362/802; 362/13

(58) Field of Search .......................... 315/185.5, 185 R, 315/178, 179, 180, 312, 314, 316, 169.1, 363, 320; 362/800, 13, 12, 802, 803, 806, 808, 809, 812

(56) References Cited

U.S. PATENT DOCUMENTS 4,223,248 A * 9/1980 Tong ...................... 315/185 S
5,142,203 A * 8/1992 Oda et al. ................... 315/308
5,254,910 A * 10/1993 Yang .......................... 315/313
5,374,876 A * 12/1994 Horibata et al. ............ 315/313
5,384,519 A * 1/1995 Gotoh ........................ 315/324
5,619,182 A * 4/1997 Robb ......................... 340/479
5,661,645 A * 8/1997 Hochstein .................... 363/89
5,663,719 A * 9/1997 Deese et al. ................ 340/912
5,808,592 A * 9/1998 Mizutani et al. .............. 345/83
5,894,201 A * 4/1999 Wong ......................... 315/241
6,149,283 A * 11/2000 Conway et al. ............. 362/236
6,150,771 A * 11/2000 Perry ......................... 315/291
6,160,354 A * 12/2000 Ruvinskiy et al. ....... 315/169.3
6,166,496 A * 12/2000 Lys et al. .................. 315/316

* cited by examiner

*Primary Examiner*—Hoang Nguyen
*Assistant Examiner*—Tuyet T. Vo
(74) *Attorney, Agent, or Firm*—Orum & Roth

(57) ABSTRACT

A railway searchlight signal uses a printed circuit board populated by three arrays (green, red and yellow) of LEDs. The LEDs are lit by a standard color light power supply unit (PSU). As only one array of LEDs is lit at a time, an interface between the PSU and the LEDs is provided to select which LED array to couple with the PSU. External repeater contacts provide information on which aspect is displayed. This searchlight system design is failsafe in that no single failure of a component will produce a less restrictive aspect.

20 Claims, 3 Drawing Sheets

METHOD AND DEVICE TO EMULATE A RAILWAY SEARCHLIGHT SIGNAL WITH LIGHT EMITTING DIODES

BACKGROUND OF THE INVENTION

1. Field of the Invention

The present invention relates to railway signals, particularly Light Emitting Diode (LED) searchlight signals.

Searchlight signals are used along railway tracks to convey information to the train driver, they can display three colors (red, yellow or green) out of the same lamp by placing a filter in front of it. These searchlight signals are composed of an incandescent lamp, a reflector, a lens system and three colored filters or "roundels"(red, yellow and green). An electromechanical three position DC motor mechanism selects the proper filter to be used. This electromechanical system is controlled by an external DC control voltage. In the absence of any control voltage, the red filter remains in front of the light beam, displaying a red aspect. If the control voltage is positive (12V), the yellow filter is moved in front of the light beam and a yellow aspect is displayed. If the control voltage is negative (−12V), the green lens is placed in front of the light beam, displaying a green aspect. Six external repeater contacts are also used, providing feedback information to a central control installation on which aspect is currently displayed or not displayed. These contacts are used in other stages of the signaling system.

This searchlight mechanism has been used for over a century by the railway industry but it has two major drawbacks. First, it is very expensive due to the complexity of its electromechanical and optical systems. Second, its maintenance costs are high due to the relatively short life of the incandescent lamps and the required periodic maintenance and calibration of the internal electromechanical mechanism.

The present invention uses the high reliability and long life of LEDs and the versatility of a switching power supply to create an LED searchlight signal that can be easily retrofitted into existing signal systems. This new searchlight signal features relatively low capital and operating costs, no bulb replacement and virtually no required maintenance for several years.

2. Description of the Related Art

U.S. Pat. No. 5,697,584 describes a searchlight signal using LEDs, reflector, light filters, light detection means and a linear power supply. An object of the present invention is to provide the reliability and energy efficiency of LEDs, without requiring the added complexity and expense of a reflector, light filters, light detection means or a linear power supply.

SUMMARY OF THE INVENTION

The present invention uses a printed circuit board populated by three arrays (green, red and yellow) of LEDs. The LEDs are lit by a standard color light power supply unit (PSU). As only one array of LEDs is lit at a time, an interface between the PSU and the LEDs is provided to select which LED array to couple with the PSU. External repeater contacts provide information on which aspect is displayed. This searchlight system design is failsafe in that no single failure of a component will produce a less restrictive aspect.

DETAILED DESCRIPTION OF THE INVENTION

Figure 1:
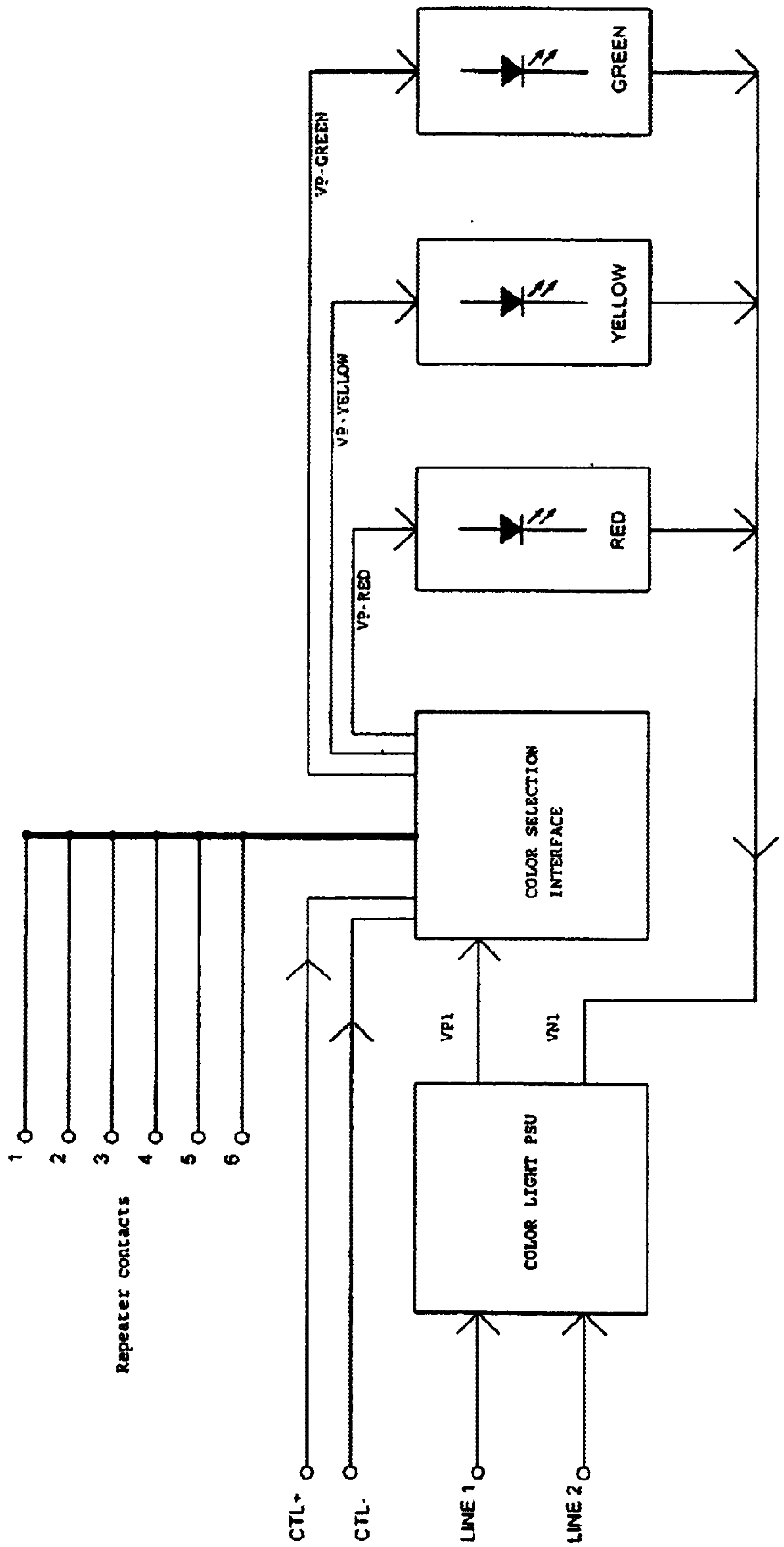
FIG. 1 is a block diagram of the invention.

The block diagram of the system is shown in FIG. 1. Each subsystem will be explained in detail below.

The color light PSU is generically described in U.S. patent application Ser. No. 09/543,240, incorporated herein by reference. It consists of a switching power supply which regulates the current through the LEDs. The current flowing through the LEDs is always constant, regardless of the color displayed. Other options provided by the color light PSU (described in detail in application Ser. No. 09/543,240) include the pre-set turn-off voltage, cold filament detection test compatibility and fuse blow out (FBO) option which emulates the behavior of an incandescent lamp. These features add extra safety in the design. The main purpose of the PSU is to light the LEDs by boosting the input voltage at line 1 and line 2 (12V AC or DC) to a voltage between VP1 and VN1 required by the LED arrays (between 50V and 80V, depending on the color) and to regulate the current through the LEDs. The selected LED array always sees a constant current as long as the input voltage is within the specified design voltage range.

Figure 2:
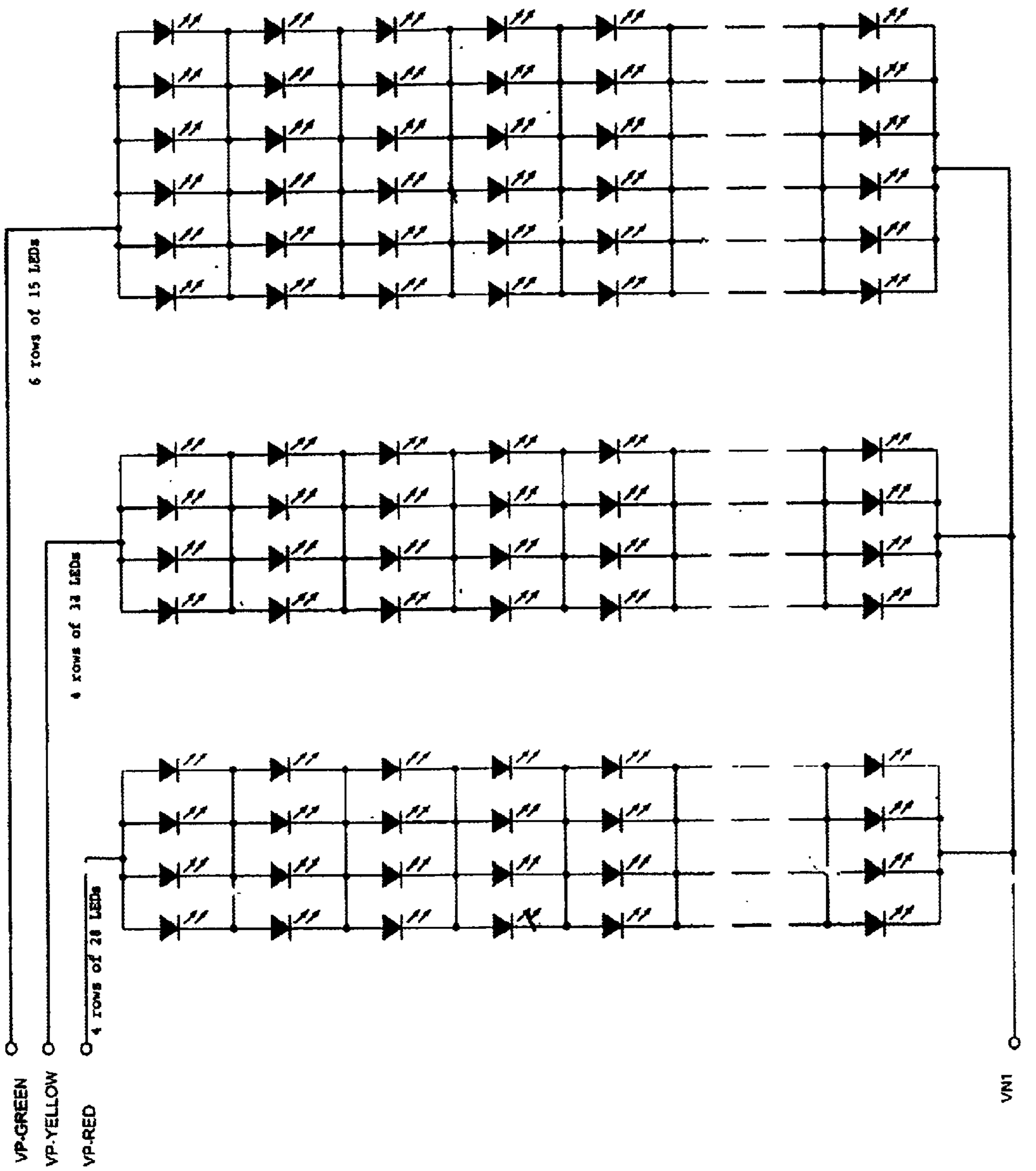
FIG. 2 a schematic showing interconnection of the LEDs.

As shown in FIG. 2, there is one separate LED array for each color. Each array is arranged so that all LEDs are in series and parallel. In a preferred embodiment of the invention, the red array has 4 rows of 28 red LEDs; the yellow array has 4 rows of 33 yellow LEDs; and the green array has 6 rows of 15 green LEDs (see FIG. 2). This particular number of LEDs was chosen for light output considerations. The currently available LEDs having varying light output levels and voltage drops depending on the color of light desired. The advantage of arranging the LEDs in series/parallel array is that loss of one LED does not result in loss of all LEDs. An LED failing short will short only those LEDs that are in parallel and an LED failing open will result in the loss of that LED only. LEDs are distributed on the printed circuit board so that each aspect is displayed uniformly. In the preferred embodiment, secondary optics are not used. It is however, possible to add a lens system if desired.

Figure 3:
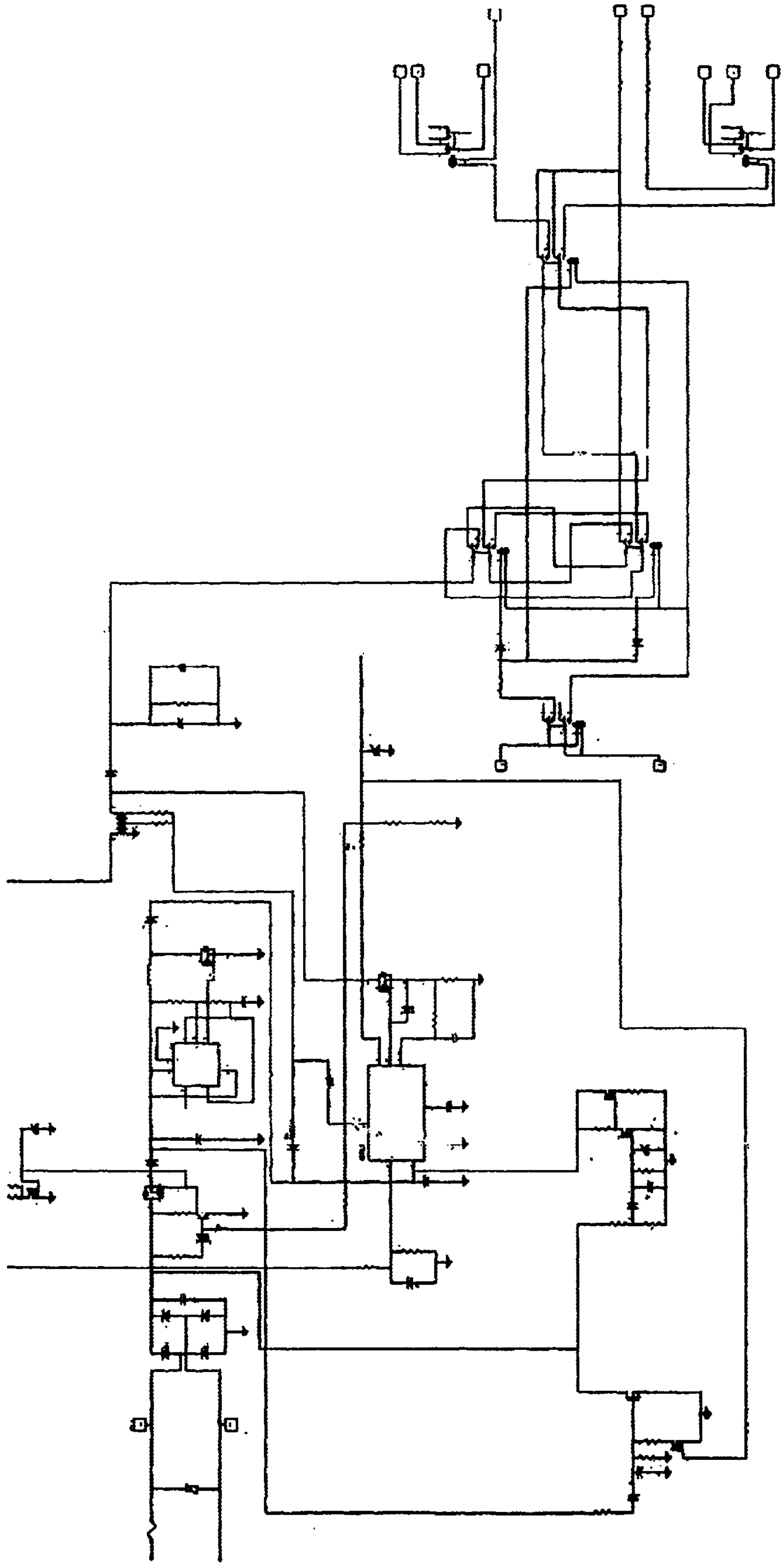
FIG. 3 is a schematic of the power supply unit (PSU).

Referring to FIG. 3, the color selection interface is formed by switch means comprising electro mechanical relays K1, K2, K3, K4, K5 and K6, diodes D17 and D18, and resistors R37, R38, R39, R40 and R41. All the other components are part of the color light PSU. The output of the PSU (VP1) is coupled to one of the LED arrays (VP-Red, VP-Yellow and VP-Green) depending on the input mean of the control voltage grounded between terminals CTL+ and CTL−.

When there is no control voltage, VP1 is coupled to VP-Red through K1 and K2, lighting the red aspect. When the control voltage is positive, D17 is forward biased coupling VP1 to VP-Yellow through K1, K2 and K5, lighting the yellow aspect. Current flowing through the coil of K3 activates the proper repeater contacts (1,2 and 3) necessary for retro-fitting the signals. When the control voltage is negative, D18 is forward biased, coupling VP1 to VP-Green through K1,K2 and K5, lighting the green aspect. Current flowing through the coil of K4 activates the proper repeater contacts (4,5 and 6).

Resistors R38, R39, R40 and R41 adjust the load voltage across the red and green LEDs so that it is the same as that of the yellow LEDs. The voltage across each array is not the same since there is a different number of LEDs in each array and the voltage drop varies with the color of the LED. It is important that each load have around the same voltage so that there are no current spikes flowing through the LEDs when switching from one color to another. A single failure on any of the relay contacts will not result in a less restrictive aspect being shown, regardless of the status of the PSU (a blank signal being considered more restrictive than a red signal).

The present invention is entitled to a range of equivalents, and is to be limited in a scope only by the following claims.

I claim:

1. A searchlight signal with a multiple color display aspects comprising:

a color selection interface to select the display aspect, said color selection interface connected to repeater contacts, a plurality of Light Emitting Diodes, and a switching power supply, the switching power supply coupled to the Light Emitting Diodes via the color selection interface;

wherein the display aspect is selected from the group consisting of red, yellow, green and off.

2. The signal of claim 1, wherein the switching power supply has a pre-set turn-off voltage.

3. The signal of claim 1, wherein the switching power supply has fuse blow out circuitry.

4. The signal of claim 1, wherein said Light Emitting Diodes are arranged in arrays, one array for each color of light.

5. The signal of claim 4, wherein said Light Emitting Diodes emit red, green and yellow light.

6. The signal of claim 4, wherein said Light Emitting Diodes arranged in said arrays are electrically interconnected in both series and parallel.

7. A searchlight signal with a multiple color display aspect comprising:

a color selection interface;

a plurality of light emitting diodes; and a switching power supply having cold filament test capability, the switching power supply coupled to the light emitting diodes via the color selection interface.

8. The signal of claim 7, wherein the switching power supply has a preset turnoff voltage.

9. The signal of claim 7, wherein the switching power supply has fuse blowout circuitry.

10. The signal of claim 7, wherein switch means are used in the color selection interface, said switch means configured in a failsafe manner so that if one switch means fails, the resulting display aspect will not be less restrictive than input means request.

11. The signal of claim 10, wherein the switch means are electromechanical relays.

12. The signal of claim 7, wherein said light emitting diodes are arranged in arrays, one array for each color of light; and said light emitting diodes arranged in said arrays are electrically interconnected in both series and parallel.

13. The signal of claim 12, wherein said light emitting diodes emit red, green, and yellow light.

14. A searchlight signal with a multiple color display aspect comprising:

a color selection interface comprising a switch means;

a plurality of light emitting diodes; and a switching power supply;

the switching power supply coupled to the light emitting diodes;

wherein said switch means configured in a fail safe manner so that if one switch means fails the resulting display aspect will not be less restrictive than input means request.

15. The signal of claim 14, wherein the switch means are electromechanical relays.

16. The signal of claim 14, wherein the switching power supply has a preset turnoff voltage.

17. The signal of claim 14, wherein the switching power supply has cold filament detection test capability.

18. The signal of claim 14, wherein the switching power supply has fuse blowout circuitry.

19. The signal of claim 14, wherein said light emitting diodes are arranged in arrays, one array for each color of light; and said light emitting diodes arranged in said arrays are electrically interconnected in both series and parallel.

20. The signal of claim 19, wherein said light emitting diodes emit red, green, and yellow light.

* * * * *